US 6,737,744 B2

(12) United States Patent
Fukuyama

(10) Patent No.: US 6,737,744 B2
(45) Date of Patent: May 18, 2004

(54) SEMICONDUCTOR DEVICE INCLUDING POROUS INSULATING MATERIAL AND MANUFACTURING METHOD THEREFOR

(75) Inventor: Shun-ichi Fukuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/093,502

(22) Filed: Mar. 11, 2002

(65) Prior Publication Data

US 2003/0057561 A1 Mar. 27, 2003

(30) Foreign Application Priority Data

Sep. 25, 2001 (JP) ........................................ 2001-291013

(51) Int. Cl.[7] ...................... H01L 23/48; H01L 23/52; H01L 29/40
(52) U.S. Cl. ...................................... 257/750; 257/758
(58) Field of Search ............................. 257/750, 758, 257/762, 622

(56) References Cited

U.S. PATENT DOCUMENTS 5,238,850 A * 8/1993 Matsunaga et al.
6,211,570 B1   4/2001 Kakamu

FOREIGN PATENT DOCUMENTS

| JP | 10-214832 | 8/1998 |
| JP | 2001-044202 | 2/2001 |
| JP | 2001-093975 | 4/2001 |

OTHER PUBLICATIONS

Taiwanese Office Action, Application No. 91103455, *Semiconductor Device Including Porous Insulating Material And Manufacturing Method Therefor*, filed, Feb. 26, 2002.

* cited by examiner

*Primary Examiner*—Sheila V. Clark
(74) *Attorney, Agent, or Firm*—Armstrong, Kratz, Quintos, Hanson & Brooks, LLP

(57) ABSTRACT

On a substrate, a first insulating film, a first interlayer insulating film, a second and third insulating films, and a second interlayer insulating film are formed. Wire trenches are formed reaching the upper surface of the third insulating film, and via holes are formed from the bottom of the wire trench to the upper surface of the first insulating film. Formation of the wire trench is performed by etching the second interlayer insulating film under a condition in which the second interlayer insulating film is selectively etched. The third insulating film exposed at the bottoms of the wire trenches and the first insulating film exposed at the bottoms of the via holes are removed by etching under a condition in which the third insulating film is selectively etched. Wires are filled in the via holes and the wire trenches.

8 Claims, 6 Drawing Sheets

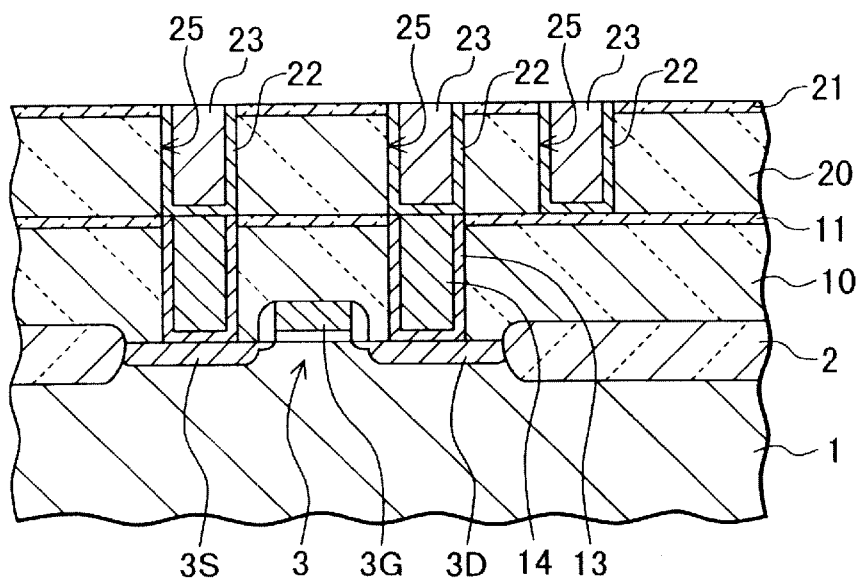
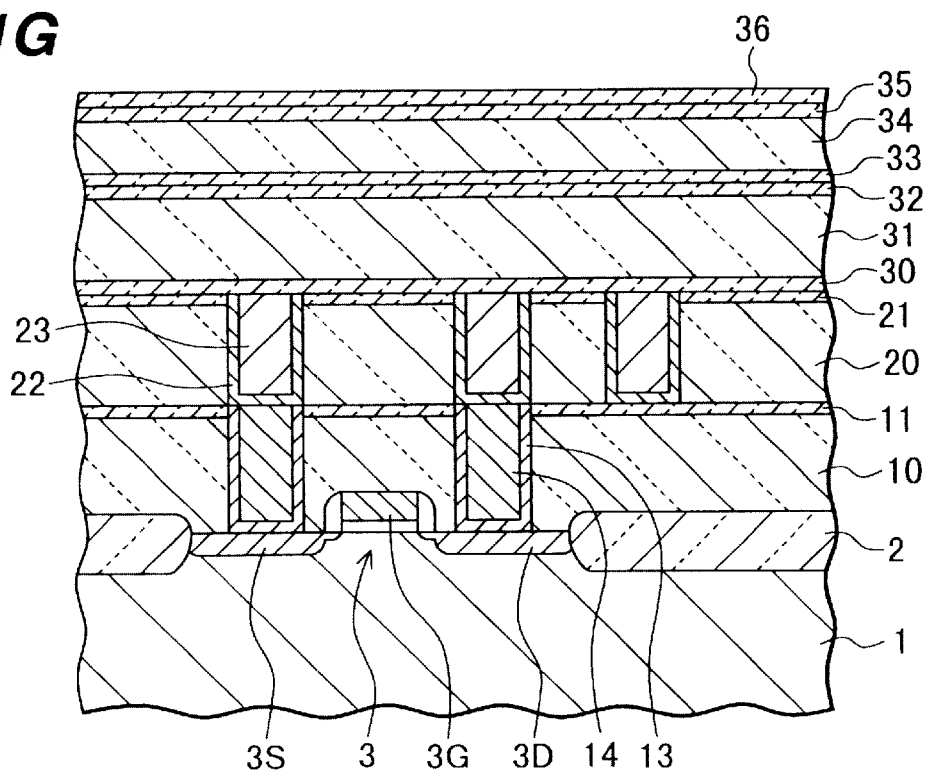

SEMICONDUCTOR DEVICE INCLUDING POROUS INSULATING MATERIAL AND MANUFACTURING METHOD THEREFOR

CROSS REFERENCE TO RELATED APPLICATION

This invention is based on and claims priority of Japanese patent application 2001-291013, filed on Sep. 25, 2001, the whole contents of which are incorporated herein by reference.

BACKGROUND OF THE INVENTION

1) Field of the Invention

The present invention relates to semiconductor devices and manufacturing methods therefor, and more particularly, relates to a semiconductor device including a porous insulating film disposed between wire layers, that is, used as a via layer, and to a manufacturing method therefor.

2) Description of the Related Art

In semiconductor integrated circuit devices, parasitic capacitance between wires has been one of significant causes for decreasing signal transmission speeds. When the distance between wires is 1 µm or more, the parasitic capacitance between the wires has a small influence on processing speed of the entire device. However, when the distance between wires is 0.2 µm or less, the distance between wires formed in the same layer becomes extremely small compared to the distance between upper and lower wires, and as a result, the parasitic capacitance between wires has a significant influence on the processing speed of the device.

The transmission speed of signals passing through multilayer wires of semiconductor integrated circuit device is determined by the combination of wire resistance and parasitic capacitance. When the thickness of a wire is reduced, the parasitic capacitance can be reduced; however, when the thickness of a wire is reduced, the wire resistance is increased, and hence, a higher signal transmission speed cannot be obtained. In order to achieve a decrease in parasitic capacitance without decreasing the thickness of a wire, it is effective that the dielectric constant of an interlayer insulating film be decreased.

As a material having a low dielectric constant, a coating type insulating material, a polytetrafluoroethylene-based (PTFE-based) material, and a hydrocarbon-based material having a linear chain structure have drawn attention. As the coating type insulating material, a polyimide or a silicone resin may be mentioned by way of example. However, even when the material mentioned above is used, it is difficult to obtain a relative dielectric constant of 3 or less. When the PTFE based material is used, the dielectric constant can be decreased to 2 or less; however, the PTFE-based material cannot be practically used since it has poor adhesion to another material. The hydrocarbon-based material having a linear chain structure is susceptible to oxidation, and when it is oxidized, the dielectric constant thereof is likely to vary due to moisture absorption.

In order to solve the problems described above, a porous material having a low dielectric constant has been developed by forming a porous insulating material.

However, when a porous material was used as an insulating material, the inventors of the present invention discovered that problems, which did not occur in the past, arose during a process for manufacturing semiconductor devices.

SUMMARY OF THE INVENTION

Accordingly, an object of the present invention is to solve the problems that occur when a porous material is used as an insulating material for use in semiconductor integrated circuit devices.

In accordance with one aspect of the present invention, there is provided a method for manufacturing a semiconductor device comprising the steps of: forming a first insulating film on a surface of a substrate, a semiconductor element being formed thereon, and having a conductive area exposed at a part of the surface thereof; forming a first interlayer insulating film on the first insulating film; forming a second insulating film on the first interlayer insulating film; forming a third insulating film on the second insulating film; forming a second interlayer insulating film on the third insulating film; forming a wire trench from the upper surface of the second interlayer insulating film to an upper surface of the third insulating film and forming a via hole from a part of a bottom of the wire trench to an upper surface of the first insulating film, in which the via hole is disposed at a position corresponding to a part of the conductive area, and the wire trench is formed by etching under a condition in which the second interlayer insulating film is selectively etched with respect to the third insulating film; removing the third insulating film exposed at the bottom of the wire trench and the first insulating film exposed at the bottom of the via hole by etching under a condition in which the third insulating film is selectively etched with respect to the second insulating film; and filling a wire which comprises a conductive material in the via hole and the wire trench.

When the third insulating film exposed at the bottom of the wire trench is removed, the second insulating film may be used as an etching stopper film. Accordingly, the upper surface of the first interlayer insulating film is prevented from being exposed at the bottom of the wire trench. According to the method described above, a semiconductor device having the structure described below can be obtained.

In accordance with another aspect of the present invention, there is provided a semiconductor device comprising: a first insulating film provided on a surface of a substrate having a conductive area exposed at a part of the surface thereof; a first interlayer insulating film provided on the first insulating film; a second insulating film provided on the first interlayer insulating film; a via hole formed from an upper surface of the second insulating film to a bottom surface of the first insulating film; a third insulating film which is provided on the second insulating film and which has a different etching resistance from that of the second insulating film; a second interlayer insulating film which is provided on the third insulating film and which has a different etching resistance from that of the third insulating film; a wire trench which is provided from an upper surface of the second interlayer insulating film to the upper surface of the second insulating film and which is connected to the via hole at a part of the bottom of the wire trench; and a wire member which comprises a conductive material and is filled in the via hole and the wire trench.

In accordance with another aspect of the present invention, there is provided a method for manufacturing a semiconductor device comprising the steps of: forming a first insulating film which comprises a porous insulating material on a surface of a semiconductor substrate; forming a first etching stopper film which comprises an insulating material on the first insulating film; forming a second etching stopper film on the first etching stopper film, the second etching stopper film comprising another insulating material which has a higher dielectric constant than that of the first etching stopper film; forming a second insulating film on the second etching stopper film; forming a mask pattern having an opening on the second insulating film; forming a recess by etching the second insulating film under a condition in which the second insulating film is selectively etched with respect to the second etching stopper film using the mask pattern as an etching mask so that the second etching stopper film is exposed at a bottom of the recess; etching the second etching stopper film exposed at the bottom of the recess under a condition in which the second etching stopper film is selectively etched with respect to the first etching stopper film: and filling a conductive member which comprises a conductive material in the recess.

When the second etching stopper film is etched, since the first etching stopper film protects the first insulating film, the first insulating film is prevented from being exposed to an etching atmosphere. According to the method described above, a semiconductor device having the structure described below can be obtained.

In accordance with another aspect of the present invention, there is provided a semiconductor device comprising: a first insulating film which comprises a porous insulating material and which is provided on a surface of a semiconductor substrate; a first etching stopper film which comprises an insulating material and which is provided on the first insulating film; a second etching stopper film provided on the first etching stopper film, the second etching stopper film comprising another insulating material which has a higher dielectric constant than that of the first etching stopper film; a second insulating film provided on the second etching stopper film; a recess which penetrates through the second insulating film and the second etching stopper film and at a bottom of which the first etching stopper film remains; and a conductive member which comprises a conductive material and is filled in the recess.

As described above, at the interface between the first interlayer insulating film and the second interlayer insulating film, two etching stopper films having different etching resistances from each other are disposed. When the wire trench is formed in the second interlayer insulating film, etching is stopped at the upper etching stopper film. When the upper etching stopper film which is exposed at the bottom of the wire trench is etched, etching is stopped at the lower etching stopper film. Accordingly, the upper surface of the first interlayer insulating film is prevented from being exposed to an etching atmosphere. When an insulating film comprising a porous material is exposed to an etching atmosphere, minute irregularities are formed on the surface of the insulating film, resulting in the occurrence of problems. Hence, the present invention is advantageously applied to the case in which a porous material is used as an insulating film.

BRIEF DESCRIPTION OF THE DRAWINGS

FIGS. 1A to 1K are each cross-sectional views of a semiconductor device in a step of a manufacturing method according to an embodiment of the present invention.

DETAILED DESCRIPTION OF THE PREFERRED EMBODIMENTS

Figure 1A:
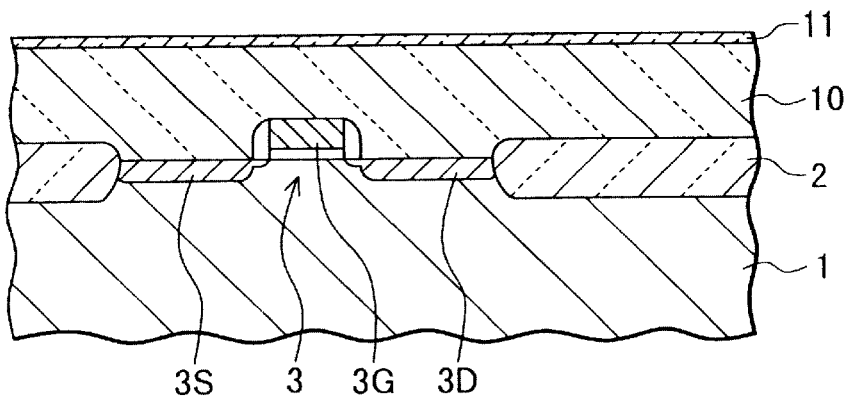
Figure 1B:
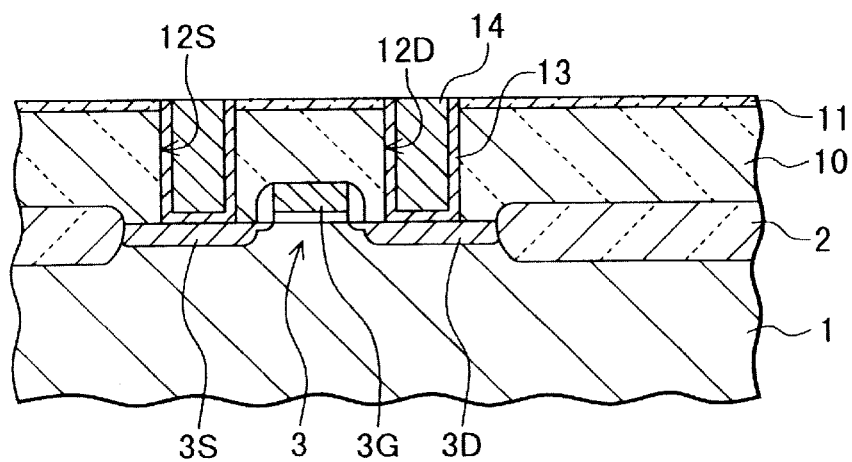
Figure 1C:
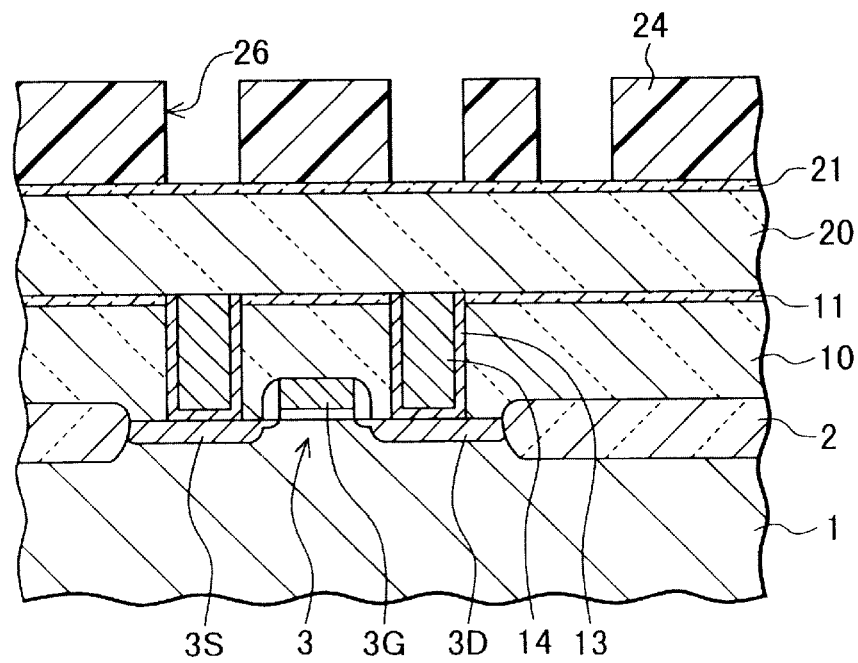
Figure 1D:
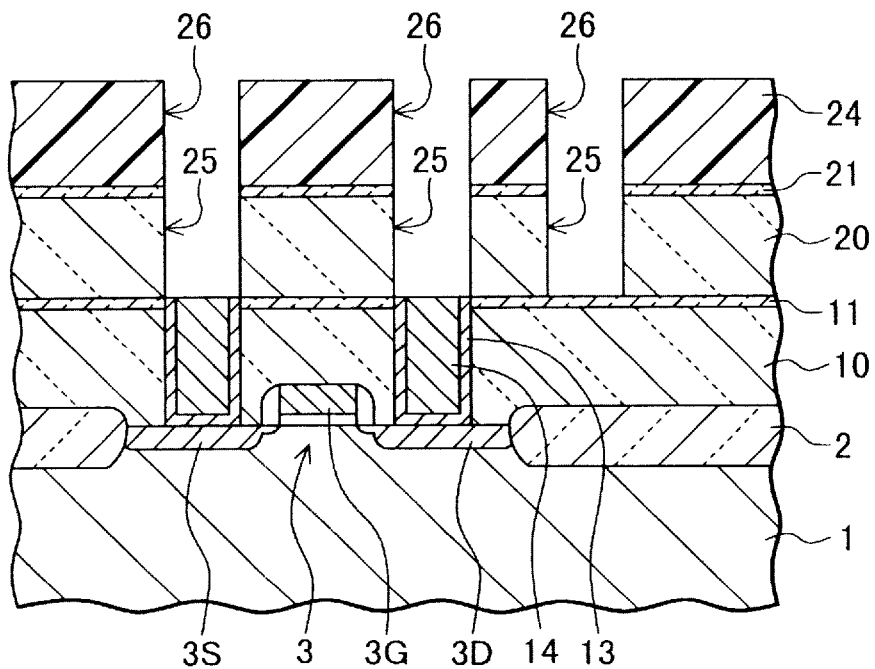
Figure 1E:
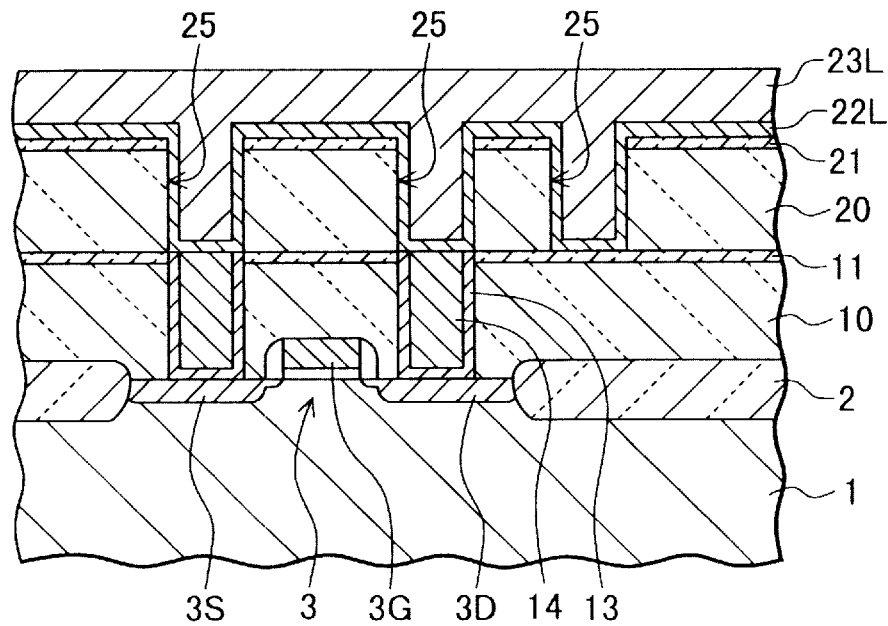
Figure 1H:
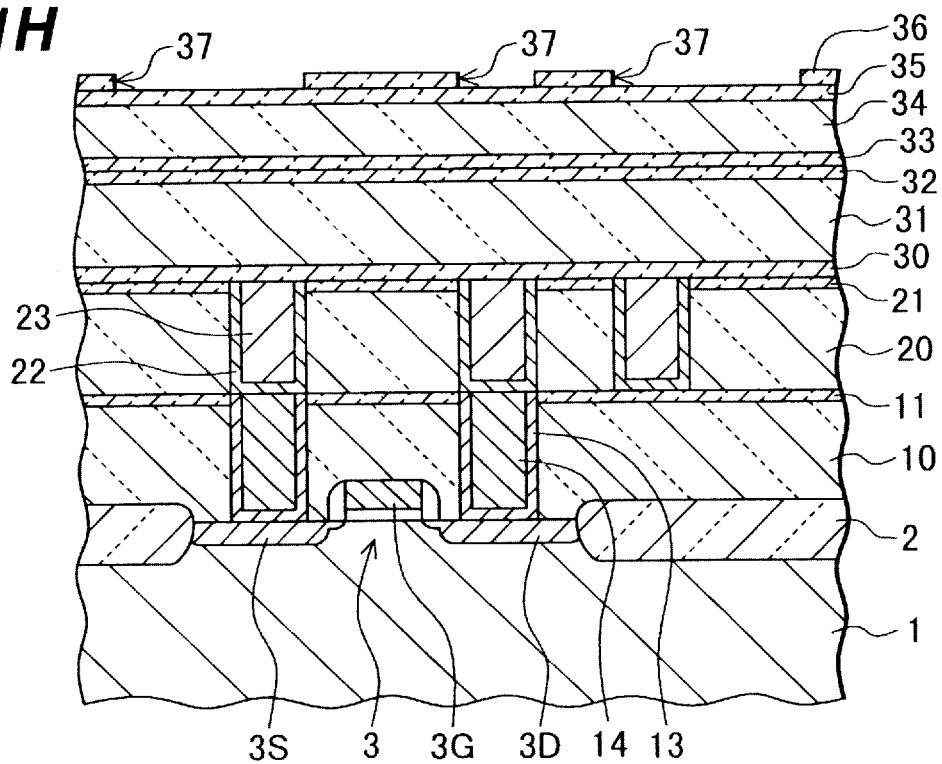
Figure 1I:
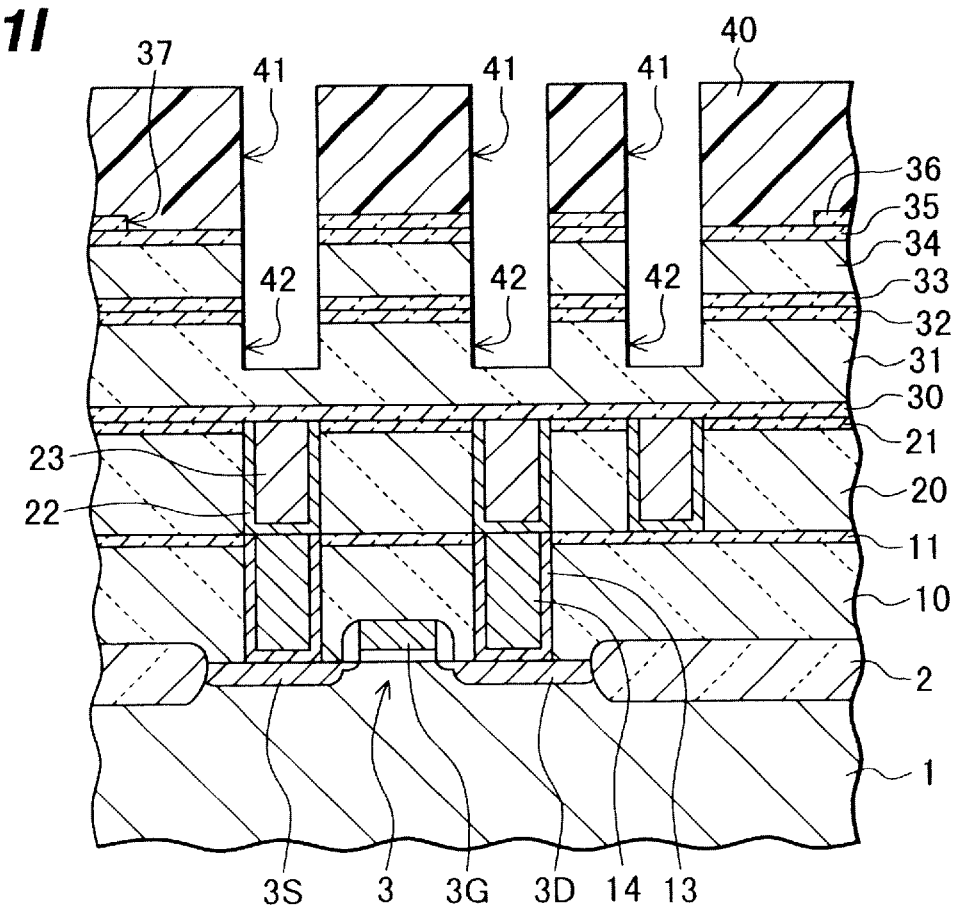
Figure 1J:
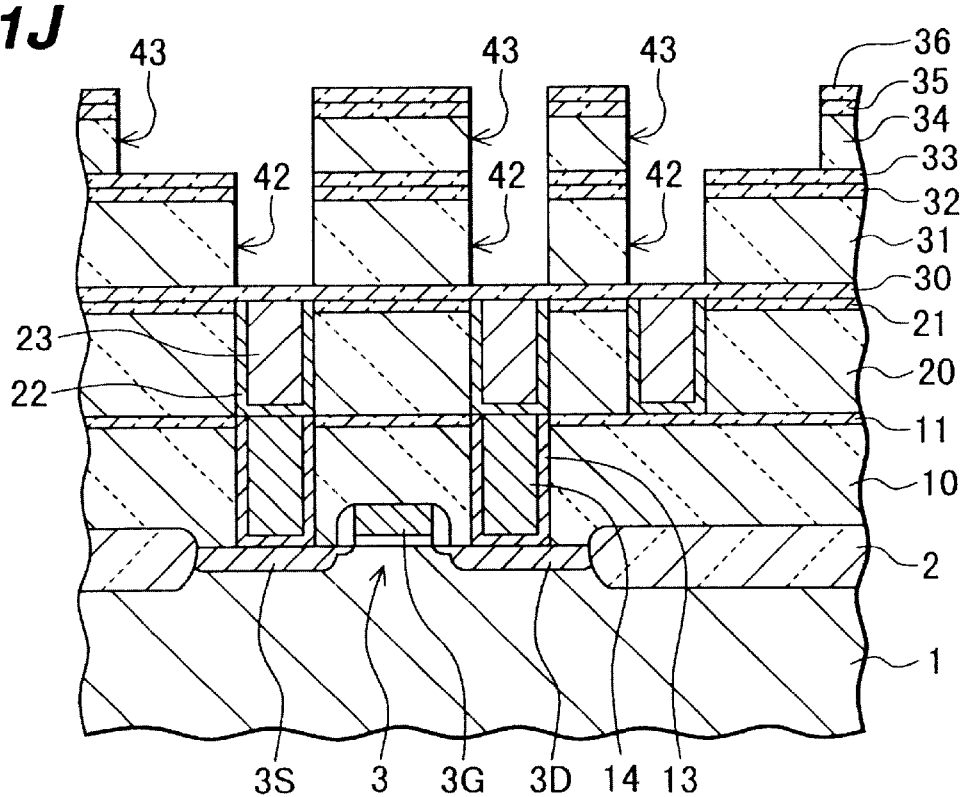
Figure 1K:
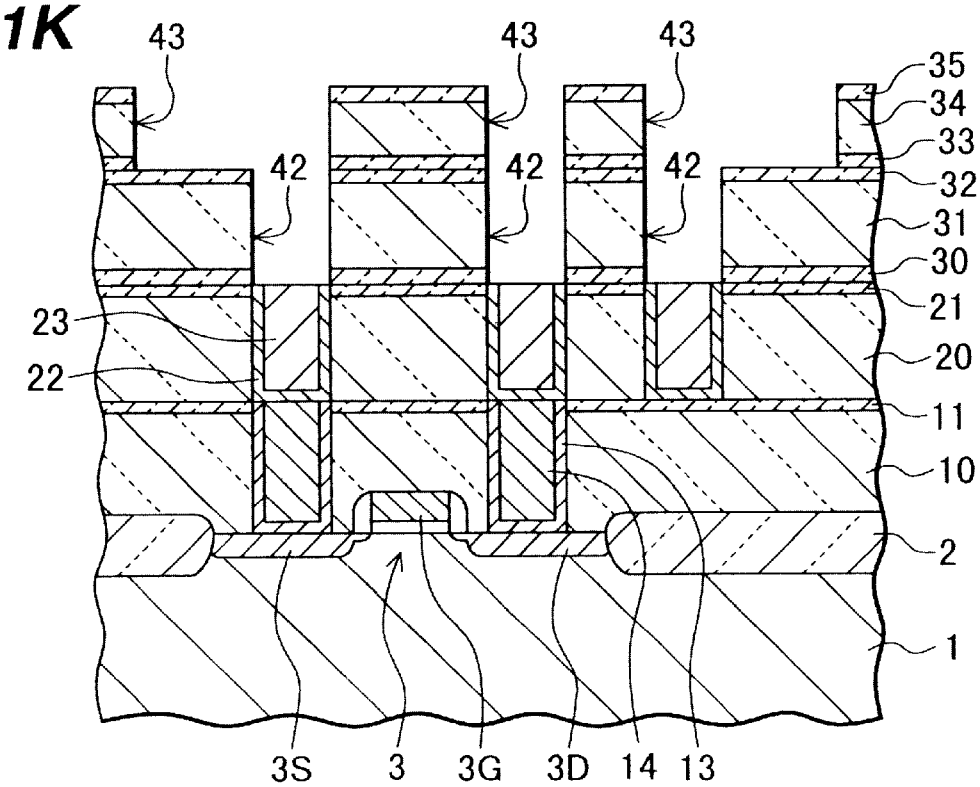
Figure 2:
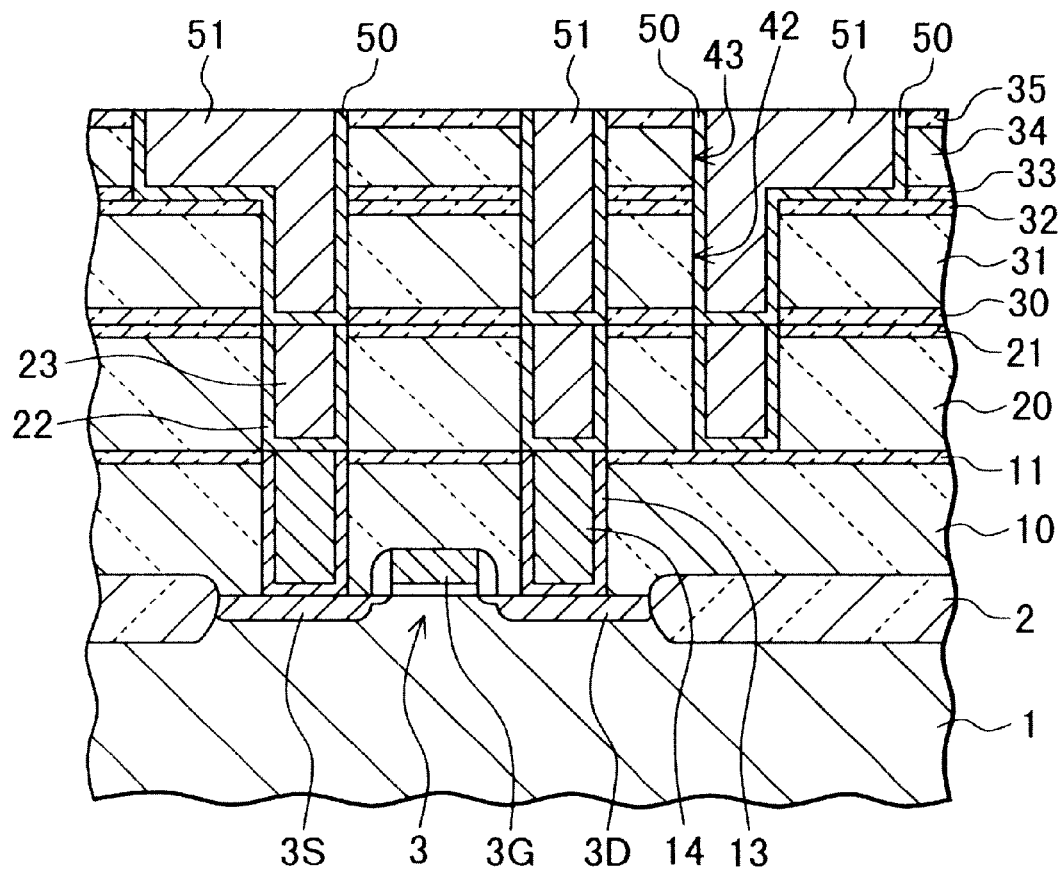
FIG. 2 is a cross-sectional view of a semiconductor device according to an embodiment of the present invention.

Referring to FIGS. 1A to 2, a method for manufacturing a semiconductor device, according to an embodiment of the present invention, will be described.

As shown in FIG. 1A, an element separation insulating region 2 is formed on a surface of a substrate 1 consisting of silicon. The element separation insulating region 2 is formed by local oxidation of silicon (LOCOS) or shallow trench isolation (STI). On an active region surrounded by the element separation insulating region 2, a MOSFET 3 including a gate electrode 3G, a source region 3S, and a drain region 3D is formed. The MOSFET 3 is formed by repeating known steps of film-formation, photolithography, etching, ion implantation, and the like.

On the surface of the substrate 1, an interlayer insulating film 10 of 1,000 nm thick consisting of phosphosilicate glass (PSG) is formed by chemical vapor deposition (CVD) so as to cover the MOSFET 3. On the interlayer insulating film 10, an etching stopper film 11 (using as a passivation film) of 50 nm thick consisting of silicon carbide (SiC) or silicon nitride (SiN) is formed by plasma enhanced CVD (PE-CVD).

Steps for obtaining the state shown in FIG. 1B will be described. Contact holes 12S and 12D, which reach the source region 3S and the drain region 3D, respectively, are formed in the etching stopper film 11 and the interlayer insulating film 10.

A barrier metal layer 13 having a thickness of 30 nm is formed to cover the inner surfaces of the contact holes 12S and 12D and the upper surface of the etching stopper film 11. The barrier metal layer 13 is formed of, for example, titanium nitride (TiN) or tantalum nitride (TaN). On the surface of the barrier metal layer 13, a tungsten (W) layer having a thickness sufficient to fill the contact holes 12S and 12D is formed. The formation of the barrier metal layer and the W layer are performed by, for example, CVD.

An excess W layer and barrier metal layer are removed by chemical mechanical polishing (CMP) so as to expose the etching stopper film 11. Accordingly, in the contact holes 12S and 12D, conductive plugs 14, each of which is composed of the barrier metal layer 13 and W layer, are formed.

As shown in FIG. 1C, on the etching stopper film 11, an interlayer insulating film 20 having a thickness of 150 nm is formed. The interlayer insulating film 20 is formed of porous silica (IPS manufactured by Catalysts & Chemical Ind. Co., Ltd). The composition of this porous silica and a film-formation method therefor are described in "SHOKUBAI KASEI GIHOU" (Technical Report by Catalysts & Chemicals) vol. 17, pages 75 to 82, 2000. Hereinafter, the film-formation method will be briefly described.

Spin coating of a solution, which contains an organic oligomer and a siloxane polymer dispersed in a solvent, is performed on a surface of a substrate. When the coating film is dried, a film in which the organic oligomer and the siloxane polymer are finely mixed together is obtained. By firing this film thus formed, the organic oligomer is only pyrolyzed, and hence, a film consisting of porous siloxane polymer is obtained.

On the interlayer insulating film 20, a cap film 21 consisting of silicon oxide ($SiO_2$) 50 nm thick is formed by PE-CVD. On the cap film 21, a resist pattern 24 is formed. In the resist pattern 24, openings 26 corresponding to wires formed in the interlayer insulating film 20 are provided. The openings 26 are formed by a general photolithographic method.

As shown in FIG. 1D, the cap film 21 and the interlayer insulating film 20 are etched using the resist pattern 24 as a mask. The cap film 21 and the interlayer insulating film 20 are etched by reactive ion etching (RIE) using a mixed gas consisting of $C_3F_8$, $O_2$, and Ar as an etching gas. Accordingly, wiring trenches 25 corresponding to the openings 26 in the resist pattern 24 are formed in the interlayer insulating film 20. The upper surfaces of the conductive plugs 14 are exposed at the bottom surfaces of the corresponding wiring trenches 25. After the wiring trenches 25 are formed, the resist pattern 24 is removed.

As shown in FIG. 1E, a barrier metal layer 22L having a thickness of 30 nm is formed so as to cover the inside surfaces of the wiring trenches 25 and the upper surface of the cap film 21. The barrier metal layer 22L is consisting of TiN or TaN and is formed by CVD or PVD. On the surface of the barrier metal layer 22L, a conductive layer 23L consisting of copper (Cu) is formed. After the surface of the barrier metal layer 22L is covered with a seed layer consisting of Cu, the conductive layer 23L is formed by electroplating of Cu so as to have a thickness sufficient to fill the wiring trenches 25.

As shown in FIG. 1F, CMP is performed so as to expose the cap film 21. Accordingly, in the wiring trench 25, a barrier metal layer 22 covering the inside thereof and a Cu wire 23 which fills the wiring trench 25 are formed.

As shown in FIG. 1G, a diffusion barrier film 30 of 50 nm thick consisting of SiC, an interlayer insulating film 31 of 250 nm thick consisting of porous silica, a lower etching stopper film 32 of 30 nm thick consisting of $SiO_2$, an upper etching stopper film 33 of 30 nm thick consisting of SiC, an interlayer insulating film 34 of 150 nm thick consisting of porous silica, a cap film 35 of 20 nm thick consisting of $SiO_2$, and a hard mask 36 of 50 nm thick consisting of SiN are formed in this order on the cap film 21.

The diffusion barrier film 30 and the upper etching stopper film 33 are formed by PE-CVD using tetramethylsilane as a source gas and $CO_2$ as a carrier gas. The interlayer insulating film 31 and the interlayer insulating film 34 are formed by the same method as that used for forming the interlayer insulating film 20.

The lower etching stopper film 32 and the cap film 35, which are consisting of $SiO_2$, are formed by PE-CVD using silane ($SiH_4$) and nitrogen monoxide ($N_2O$) as source gases. The hard mask 36 is formed by CVD using $SiH_4$ and $NH_3$ as source gases.

As shown in FIG. 1H, the hard mask 36 is patterned so as to form openings 37. The openings 37 correspond to patterns of wires which are formed in the interlayer insulating film 34. The hard mask 36 is patterned by using a general photolithographic technique.

As shown in FIG. 1I, on the cap film 35 which is exposed at the bottoms of the openings 37 and on the hard mask 36, a resist pattern 40 is formed. The resist pattern 40 has openings 41 corresponding to via holes which are to be formed in the interlayer insulating film 31. When viewed in the direction parallel with the normal line of the substrate, the opening 41 is inside the opening 37 formed in the hard mask 36.

Etching from the cap film 35 to the midway of the interlayer insulating film 31 is performed using the resist pattern 40 as a mask, so that via holes 42 are formed. Etching of the cap film 35 consisting of $SiO_2$, the lower etching stopper film 32, the interlayer insulating film 34 consisting of porous silica, and the interlayer insulating film 31 is performed by RIE using a mixed gas of $C_2F_6$, $O_2$, $N_2$, and Ar. Etching of the upper etching stopper film 33 consisting of SiC is performed by RIE using $CH_2F_2$, $O_2$, and Ar.

After the via holes 42 are formed, the resist pattern 40 is removed by ashing.

As shown in FIG. 1J, the interlayer insulating film 34 is etched using the hard mask 36 as a mask. In the step described above, the bottom surfaces of via holes 42 which reach the midway of the interlayer insulating film 31 are further etched using the upper etching stopper film 33 as a mask, and as a result, the via holes 42 penetrate through the interlayer insulating film 31. This etching may be performed by RIE using a mixed gas containing $C_2F_6$, $O_2$, $N_2$, and Ar. Since this etching gas has a low etching rate for etching SiC or SiN, etching is stopped at the bottoms of the wire trenches 43 because of the presence of the upper etching stopper film 33, and etching is also stopped at the bottoms of the via holes 42 because of the presence of the diffusion barrier film 30.

As described above, by forming the upper etching stopper film 33 and the interlayer insulating film 34 are formed of materials different from each other in terms of etching resistance, the interlayer insulating film 34 can be selectively etched, and hence, the upper etching stopper film 33 can reproducibly be obtained. In addition, by forming the diffusion barrier film 30 and the interlayer insulating film 31 are formed of materials different from each other in terms of etching resistance, the interlayer insulating film 31 can be selectively etched, and hence, the diffusion barrier film 30 can reproducibly be obtained. In this embodiment, "difference in terms of etching resistance" does not mean that two layers exhibit different properties (resistance) when being etched by using a specific etchant under specific conditions but means that two layers have relatively different etching properties (resistances).

As shown in FIG. 1K, the hard mask 36, the upper etching stopper film 33 which is exposed at the bottoms of the wire trenches 43, and the diffusion barrier film 30 which is exposed at the bottom of the via holes 42 are etched. This etching may be performed by RIE using $CH_2F_2$, $O_2$, and Ar. Since this etching gas has a slow etching rate for etching $SiO_2$, the lower etching stopper film 32 can reproducibly be obtained at the bottoms of the wire trenches 43. Accordingly, the upper surface of the interlayer insulating film 31 is not exposed, that is, it is not exposed to the etching atmosphere.

As shown in FIG. 2, the inside surfaces of the via holes 42 and the wire trenches 43 are covered with a barrier metal layer 50 consisting of TaN, and cupper wires 51 are filled in the via holes 42 and the wire trenches 43. The barrier metal layer 50 and the Cu wires 51 are formed in a manner equivalent to the method for manufacturing the barrier metal layer 22 and the Cu wires 23 for the first wiring layer.

In the embodiment described above, as shown in FIG. 1K, even after the wire trenches 43 are formed, the upper surface of the interlayer insulating film 31 is covered with the lower etching stopper film 32. Accordingly, the occurrence of the problems described below can be prevented.

When the upper surface of the interlayer insulating film 31 consisting of porous silica is exposed to an etching atmosphere, minute irregularities are formed. When minute irregularities are formed on the bottom of the wire trench 43, it becomes difficult for the barrier metal layer 50 to completely cover the bottom of the wire trench 43. When the bottom of the wire trench 43 is insufficiently covered, the function of preventing the diffusion of Cu atoms contained in the Cu wire 51 cannot satisfactorily be obtained.

In order to completely cover the bottom of the wire trench 43 having irregularities, the thickness of the barrier metal layer 50 must be increased. However, when the thickness of the barrier metal layer 50 is increased, the cross-sectional area of the Cu wire 51 is decreased, and as a result, the wire resistance is increased.

The interlayer insulating film 34 is exposed to an etching atmosphere at the side surfaces of the wire trench 43, and the interlayer insulating film 31 is exposed to an etching atmosphere at the side surface of the via hole 42. However, since this etching is anisotropically performed, irregularities are not substantially formed on the side surfaces which are almost perpendicular to the surface of the substrate.

In FIG. 1K, the case is considered in which the upper surface of the interlayer insulating film 31 is only covered with the upper etching stopper film 33 without disposing the lower etching stopper film 32. In the case described above, when the diffusion barrier film 30 formed at the bottom of the via hole 42 is totally removed, the upper etching stopper film 33 must remain at the bottom of the wire trench 43. In order to prevent the generation of inadequate removal of the diffusion barrier film 30, over-etching of approximately 100% is generally performed.

Since the diffusion barrier film 30 and the upper etching stopper film 33 are consisting of SiC, in order to reproducibly obtain the upper etching stopper film 33, the thickness thereof must be two times or more the thickness of the diffusion barrier film 30. However, when the thickness of the upper etching stopper film 33 is increased, the effect of decreasing parasitic capacitance obtained by using porous silica as an insulating material is decreased.

In the embodiment described above, the lower etching stopper film 32 having etching resistance different from that of the diffusion barrier film 30 is disposed on the upper surface of the interlayer insulating film 31, and on the lower etching stopper film 32, the upper etching stopper film 33 which can be etched under the same conditions as that for the diffusion barrier film 30 is disposed. When the diffusion barrier film 30 at the bottom of the via hole 42 is etched, since the upper surface of the interlayer insulating film 31 is covered with the lower etching stopper film 32, the thickness of the upper etching stopper film 33 can be decreased. In order to prevent an increase in parasitic capacitance, the thickness of the upper etching stopper film 33 is preferably smaller than that of the diffusion barrier film 30. In addition, $SiO_2$ forming the lower etching stopper film 32 has a dielectric constant lower than that of SiC forming the upper etching stopper film 33. Accordingly, compared to the case in which one SiC film is disposed at the interface between the interlayer insulating film 31 and the interlayer insulating film 34, the structure according to the above embodiment has an advantage in decreasing parasitic capacitance.

In the embodiment described above, the interlayer insulating film 31 and the interlayer insulating film 34 are formed of porous silica; however, when another porous insulating material is used instead, the same advantage may also be expected. For example, a porous organic insulating material may also be used for forming the interlayer insulating film 31 or the interlayer insulating film 34.

In the embodiment described above, the case in which the Cu wire is formed by a dual damascene method is described by way of example; however, metal wires other than Cu, such as an Al-based (Al alloy) wire, may also be formed. When the manufacturing method is appropriately modified, a cupper alloy wiring layer may also be formed. In addition to a dual damascene method, the embodiment described above may also be applied to another wire-forming method. For example, in the case in which the lower etching stopper film 32 and the upper etching stopper film 33 shown in FIG. 1G are formed on a porous insulating film (which corresponds to the interlayer insulating film 31 shown in FIG. 1G), and in which a metal wire is formed by a damascene method on the upper etching stopper film 33, the advantage in that the upper surface of the porous insulating film is not exposed at the bottom of the wire trench may also be obtained.

Heretofore, the present invention has been described with reference to the embodiments; however, the present invention is not limited thereto. For example, it is apparent to those who skilled in the art that various modifications, improvements, combinations, and the like may also be performed without departing from the scope of the present invention.

What is claimed is:

1. A semiconductor device comprising:
   a first insulating film provided on a surface of a substrate having a conductive area exposed at a part of the surface thereof;
   a first interlayer insulating film provided on the first insulating film;
   a second insulating film provided on the first interlayer insulating film;
   a via hole formed from an upper surface of the second insulating film to a bottom surface of the first insulating film;
   a third insulating film which is provided on the second insulating film and which has a different etching resistance from that of the second insulating film;
   a second interlayer insulating film which is provided on the third insulating film and which has a different etching resistance from that of the third insulating film;
   a wire trench which is provided from an upper surface of the second interlayer insulating film to the upper surface of the second insulating film and which is connected to the via hole at a part of the bottom of the wire trench; and
   a wire member which comprises a conductive material and is filled in the via hole and the wire trench.

2. A semiconductor device according to claim 1, wherein the first interlayer insulating film comprises a porous insulating material.

3. A semiconductor device according to claim 1, wherein the first interlayer insulating film comprises porous silica, the second insulating film comprises $SiO_2$, and the first insulating film and the third insulating film each comprise SiC or SiN.

4. A semiconductor device according to claim 1, wherein a dielectric constant of the second insulating film is lower than that of the third insulating film.

5. A semiconductor device according to claim 1, wherein the third insulating film is thinner than the first insulating film.

6. A semiconductor device according to claim 1, wherein the conductive area exposed at the part of the surface of the substrate comprises a Cu wire formed on the substrate.

7. A semiconductor device comprising:
   a first insulating film which comprises a porous insulating material and which is provided on a surface of a semiconductor substrate;
   a first etching stopper film which comprises an insulating material and which is provided on the first insulating film;
   a second etching stopper film provided on the first etching stopper film, the second etching stopper film comprising another insulating material which has a higher dielectric constant than that of the first etching stopper film;
   a second insulating film provided on the second etching stopper film;
   a recess which penetrates through the second insulating film and the second etching stopper film and at a bottom of which the first etching stopper film remains; and a conductive member which comprises a conductive material and is filled in the recess.

8. A semiconductor device according to claim 7, wherein the first insulating film comprises porous silica, the first etching stopper film comprises $SiO_2$, and the second etching stopper film comprises SiC or SiN.

* * * * *